(12) United States Patent
Barbara et al.

(10) Patent No.: US 7,378,847 B2
(45) Date of Patent: May 27, 2008

(54) EFFICIENTLY CRYO-PUMPED NMR CRYOGENIC PROBE

(75) Inventors: Thomas M. Barbara, Portland, OR (US); Alexander M. J. Hudson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 154 days.

(21) Appl. No.: 11/505,085

(22) Filed: Aug. 16, 2006

(65) Prior Publication Data

US 2008/0042649 A1  Feb. 21, 2008

(51) Int. Cl.
*G01V 3/00* (2006.01)

(52) U.S. Cl. .................................. 324/315; 324/316
(58) Field of Classification Search ............. 324/316, 324/315, 319–322; 600/410, 422; 335/216, 335/299
See application file for complete search history.

(56) References Cited

U.S. PATENT DOCUMENTS

| | | | | |
|---|---|---|---|---|
| 5,192,911 A | | 3/1993 | Hill et al. | |
| 5,520,682 A | * | 5/1996 | Baust et al. | 606/24 |
| 6,812,705 B1 | * | 11/2004 | Sellers | 324/318 |
| 6,825,664 B2 | * | 11/2004 | Kwok et al. | 324/318 |
| 6,906,517 B1 | * | 6/2005 | Huang et al. | 324/315 |
| 6,909,283 B2 | * | 6/2005 | Emeric et al. | 324/300 |
| 7,015,692 B2 | * | 3/2006 | Clarke et al. | 324/300 |
| 7,288,939 B1 | * | 10/2007 | Barbara et al. | 324/322 |
| 7,309,987 B2 | * | 12/2007 | Lukens et al. | 324/315 |
| 2005/0046423 A1 | | 3/2005 | Marek | |
| 2006/0045754 A1 | | 3/2006 | Lukens | |

OTHER PUBLICATIONS

U.S. Appl. No. 11/260,988, filed Oct. 28, 2006, Lukens, et al.

* cited by examiner

*Primary Examiner*—Brij B Shrivastav
(74) *Attorney, Agent, or Firm*—Bella Fishman; Edward H. Berkowitz

(57) ABSTRACT

The vacuum properties of a cryogenic NMR probe maintained at a desired operating temperature by a cold head heat exchanger are improved by a separate heat exchanger operating below the temperature of the cold head heat exchanger for maintaining cryo-pumping surfaces at a temperature below said selected operating temperature.

8 Claims, 4 Drawing Sheets

EFFICIENTLY CRYO-PUMPED NMR CRYOGENIC PROBE

RELATED APPLICATION DATA

This application is related to the U.S. patent application entitled "NMR Cryogenic Probe" by inventors Alexander M. J. Hudson and Atholl Gibson, which application is filed concurrently with the present application and assigned to the assignee of the present application.

BACKGROUND OF THE INVENTION

The present work is in the field of NMR apparatus and relates particularly to an NMR probe operating at cryogenic temperatures An NMR probe coil couples an RF transmitter/receiver to sample nuclei. Operation of the RF coil at cryogenic temperatures contributes a very high efficiency through enhanced Q of the resonant circuit and significant reduction of Johnson noise. These factors provide enhanced sensitivity for NMR spectra and have motivated considerable effort to realize improved cryogenic NMR probe.

A central component within the cryogenic probe is the "cold head" (that portion within the probe structure providing thermal, and often, structural support for the RF coil). The cold head is desirably regulated at a selected operating temperature. A heat exchanger comprising a part of the cold head cools the cold head to somewhat below the operating temperature, while the application of RF power to the coil adds heat to the environment and increases the thermal load on the heat exchanger with a resulting temperature rise. Often it is desired to operate the heat exchanger for operation slightly below the desired operating temperature in order to permit temperature regulation. To avoid operating below the design temperature, a coolant heater is provided to raise the temperature of the coolant inflow to the heat exchanger at the cold head. By adjustment of heater power in this manner, regulated thermal equilibrium is achieved. Regulation of the temperature of the cold head within a narrow range is necessitated for a number of reasons. Salient of these is variation with temperature of magnetic susceptibility of materials employed in the environs of the cold head resulting in magnetic field disturbance in the neighborhood of the sample; temporal variation of temperature over lengthy data acquisition, and the stability of various parameters of the equipment. To the extent of such disturbance, the precision of NMR data is degraded. NMR is necessarily practiced in a time varying regime of RF power as applied in pulse sequences and often with substantial RF power application from a (second) decoupler coil. Thermal dependence of magnetic field inhomogeneities results in a broadening of the resonant lineshape.

Certain other considerations arise for cryogenic probes. For the purposes of this work, cryogenic temperatures refers to a range below 77 K. Thermal isolation of probe components for operation at cryogenic temperatures requires an evacuated environment. It is known that the residual gas (mainly hydrogen at cryogenic temperatures) within the probe cryostat (in combination with high voltages present at RF coils in the probe) is subject to ionization. This results in significant increase in noise and consequent reduction of the signal to noise parameter, as disclosed in the US publication US 2006/0045754A1.

It is also recognized that the mechanism of cryogenic pumping is operative within the cryostat to stabilize residual gasses by adsorption on cold surfaces. Utility of the cryo-pumping mechanism is known in prior art where the accumulation of residual gas on "cold plates" provides at least temporary stabilization and removal from the excitation/de-excitation process. This process is saturable and the cold plate pumping surfaces are allowed to warm at maintenance intervals to liberate these gasses for pumping by other pumping modalities. It is common to provide turbomolecular pumps, chemical getters or ion pumping apparatus to remove these residual gasses. The effectiveness of cryo-pumping depends upon the residual gasses and the nature of the cryo-pumping surfaces among other critical particulars. Such matters are outside the scope of the present work.

One prior art apparatus, exemplary of the above description, is schematically described in its essentials at FIG. 2a. Cold head 70 comprises a thermally regulated support structure and RF coil 71, coil former (not shown) and mounting flange 70a. The cold head 70 is cooled to $(T_1-\Delta T)$ K, somewhat below a nominal desired operating temperature of $T_1$ K (for example, 25 K) by heat exchanger 78. Details of the coupling of the RF coil 71 to the RF circuit is not shown. It should be understood that the probe cryostat housing 80 has an annular geometry defining a well or bore 82 wherein a sample is introduced at room temperature.

Coolant inflow conduit 84 provides coolant to heat exchanger 78 and warmed coolant is removed through outflow conduit 85. In order to thermally regulate the cold head, it was known in prior art to drive coolant flow at a rate sufficient to maintain the heat exchanger at a temperature slightly lower than $T_1$K and to provide a heater 88 disposed between a portion of the inflow conduit 84 and the heat exchanger 78 to warm the inflowing coolant sufficiently to raise the operating temperature of the heat exchanger to $T_1$. In this manner, heat developed from RF power dissipation is transported away from the cold head 70 and the operating temperature restored by heating the coolant (or alternatively, reducing the coolant flow rate) in response to an appropriate thermal sensor. One example of this prior art is the US publication US 2005/0046423A1.

In cryogenic probes of the above description the coolant inflow conduit 84 must exhibit a very high thermal impedance and stainless steel tubing is a typical choice of suitable material. The present work has detected a degree of cryo-pumping functionality at the outer surface of this inflow conduit. Heat is applied to the inflowing coolant prior to receipt of coolant by the heat exchanger 78. This acts adversely on the cryo-pumping occurring on the outer surface of conduit 84. The cryo-pumped vapors (principally hydrogen) are in some degree released with consequent deleterious effect of increased RF noise. The present work is directed to amelioration of these undesirable characteristics.

SUMMARY OF THE INVENTION

NMR sensitivity, minimally affected by ionization related noise, is one desiderata of the present work and this is achieved by improved cryo-pumping structure. In one embodiment, the cryo-pumping surfaces comprises a cold plate disposed in relative proximity to the cold head. The cold plate(s) are thermally coupled to an independent heat exchanger whereby the stabilizationtion of remanent gasses (mostly hydrogen in the interior of the probe cryostat) continues at the desired cryo-pumping temperature which is substantially below the operating temperature of the cold head heat exchanger. In another embodiment, the coolant outflow from the cold plate heat exchanger at an intermediate temperature $T_a$ between $T_1$ and $T_0$ may be directed to the coolant inflow of the cold head heat exchanger. It is also recognized that cold RF shields conventionally disposed to surround portions of RF coil(s) may be adapted to simultaneously function as a cryo-pumping surfaces through thermal communication with the cold plate heat exchanger as above described.

DETAILED DESCRIPTION

Figure 1:
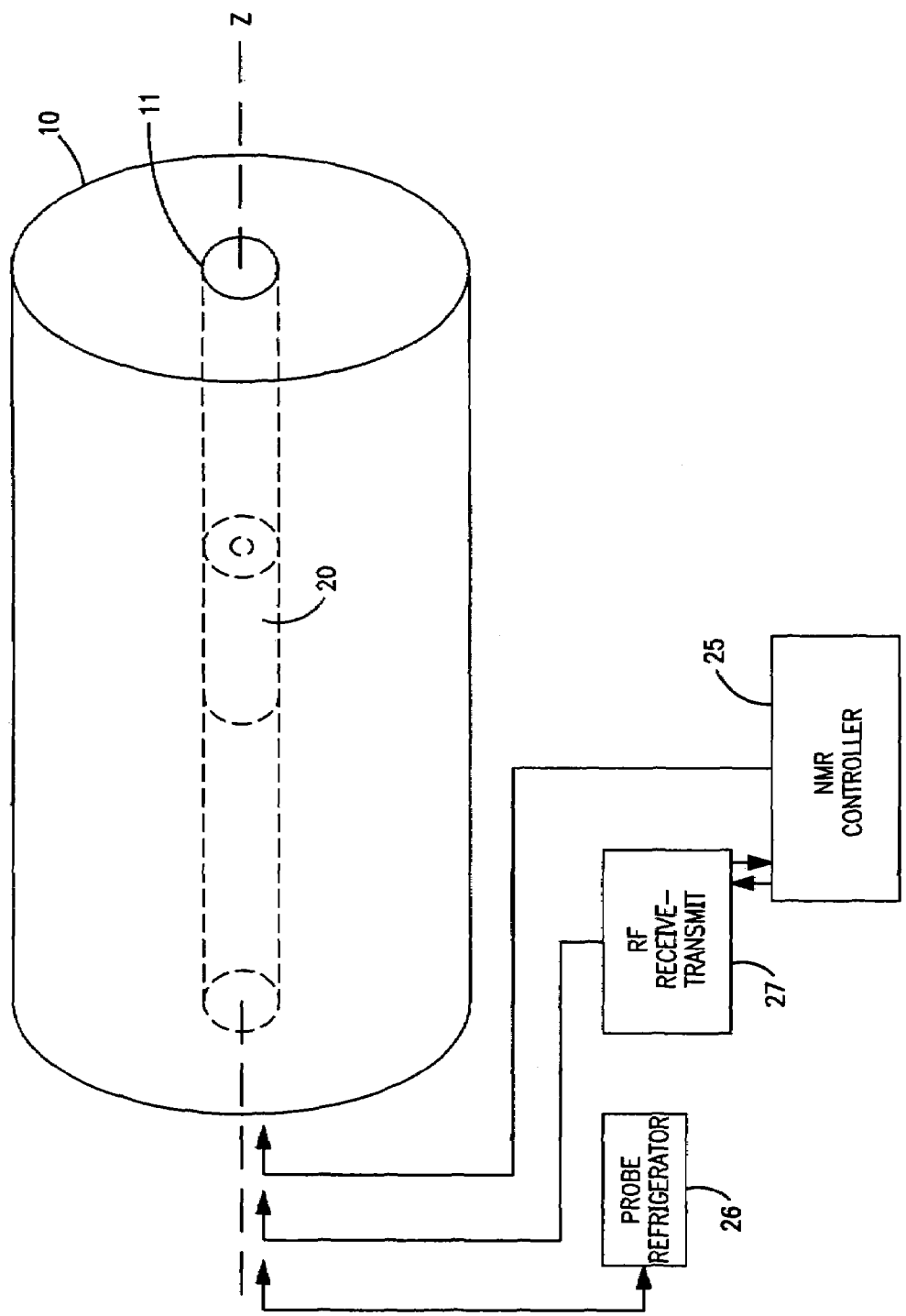
FIG. 1 is a schematic illustration of the context of the present work.

The context of the present work is conveniently described with the aid of FIG. 1. Please note that wherever convenient, the same numeric label is retained among the several embodiments and figures.

Figure 2A:
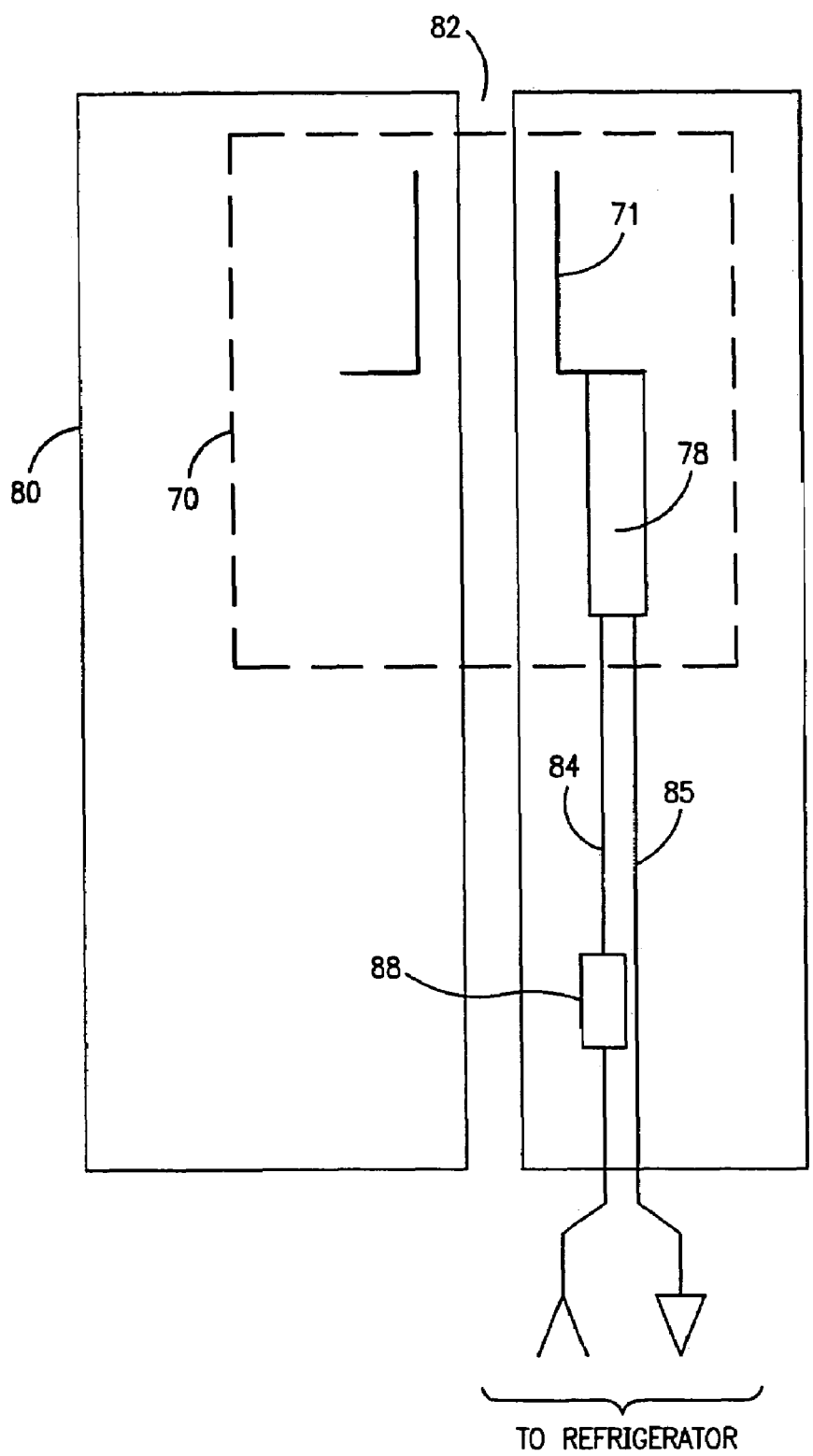
FIG. 2a is a schematic representation of a prior art cryo-probe.

A superconducting magnet cryostat 10 includes a bore 11. A probe cryostat 20 has a similar outer annular geometry coaxial with bore 11 and central coaxial bore defining a bore 82 shown in FIG. 2a to accommodate a sample. The sample (not shown) is typically studied at room temperature or some selected temperature. The sample is thermally isolated from the internal low temperature of the probe cryostat 20 and along axis z. Magnet cryostat 10 and probe cryostat 20 are typically separate and independent structures although this is not a requirement. Refrigeration apparatus for probe cryostat 20 as well as RF and DC power, and control signals are introduced to probe cryostat 20 through bore 11. Probe refrigerator unit 26 is of known design as is RF receive/transmit unit 27.

One of skill in the art recognizes that the typical NMR probe includes a decoupler coil as well as the transmit/receive coil more closely coupled to the sample. In practice, the decoupler coil sustains a far greater RF power and contributes limiting thermal properties in cryo-probe operation. It is not necessary for the purposes of this description to distinguish among these coils.

Figure 2B:
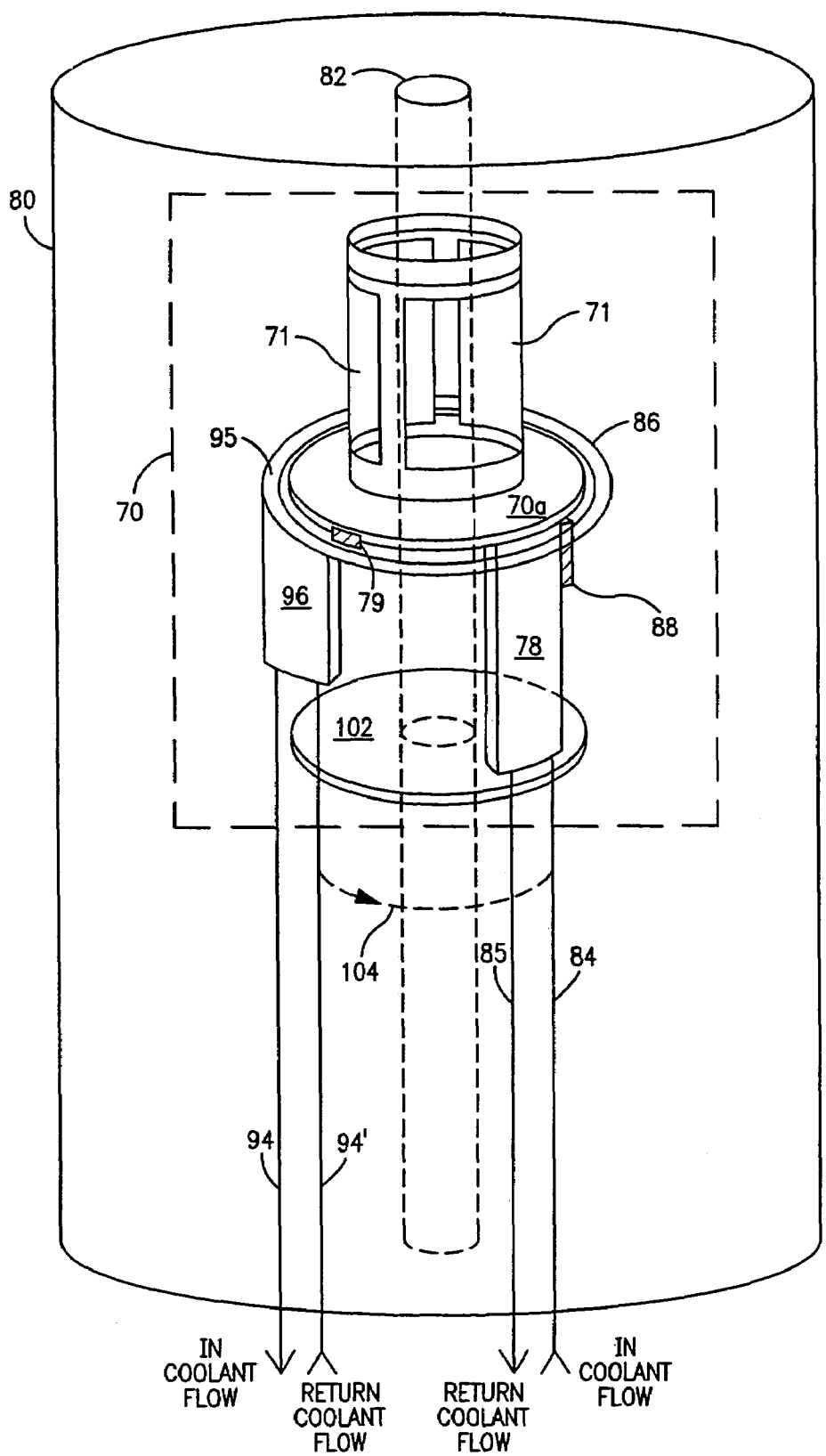
FIG. 2b represents the features of the present work.

In FIG. 2b there are shown the features which, taken together, have been found to provide much improved cryogenic probe performance. The probe cryostat housing 80 supports a vacuum environment for thermal isolation. A particular feature of the present work is the situation of heater 88, now disposed in intimate proximity to the cold head heat exchanger 78. Heater 88 is preferably disposed to supply heat directly to heat exchanger 78 by conduction. In one arrangement thermal equilibrium is established between energy supplied by the heater 88 and the heat removed from heat exchanger 78 through (principally) warm coolant outflow therefrom. For one cryogenic probe of the preferred embodiment, thermal equilibrium at a designed temperature of 25 K is established with a closed circuit helium refrigerator and a quiescent heater power of about 4 watts. This quiescent state of thermal equilibrium is disturbed by the application or removal of RF power applied to RF coil 71. Temperature sensor 79 senses a decline in temperature of the heat exchanger 78 as the RF heating increment is removed and provides an electrical response for thermal regulation by raising the heater current a measured increment. As a practical matter, the decoupler coil typically sustains major power dissipation whereas the RF power applied to an NMR excitation/observe coil is minimal by comparison. The application of RF power may be anticipated and an anticipatory signal can be derived through the NMR system controller for incorporation into the thermal regulation regime to provide a more rapid, non-oscillatory return to the quiescent thermal operating state as disclosed in the U.S. application Ser. No. 11/260,988.

Improved cryo-pumping is alternately obtained through the cold plate surfaces 95 which are cooled through an independent cold plate heat exchanger 96. Cold plate(s) 95 are preferably the coldest surface(s) at $T_0$ K in the cryo-probe and remain thermally stable through the independent operation of the cold plate heat exchanger 96 at $T_0$ K. Preferably the cold plate(s) 95 are disposed in close proximity to the cold head 70 maintained at a (higher) design temperature $T_1$ K in order to better condense the gasses liberated from the cold head and/or surfaces of RF coil 71 by heat pulses. The cold plate(s) 95 are here illustrated as annular, to accommodate the cold head centrally, but it is a straight forward variation to form this cryopumping surface as a surface of appropriate shape and orientation for cryopumping any particular source of emitted gasses and in close proximity to surfaces subject to RF heating where cryo-pumped gasses may be liberated.

It is a straightforward variation of the wholly independent cold plate heat exchanger embodiment to recognize that the outflow coolant from conduit 94' is warmed somewhat from the cold plate temperature $T_0$ K and can be, by design appropriate for inflow to cold head heat exchanger 78, thus serializing the coolant circuit. For such case, coolant return conduit 94' is converted schematically (104) to comprise the supply conduit 84 of heat exchanger 78.

Figure 3:
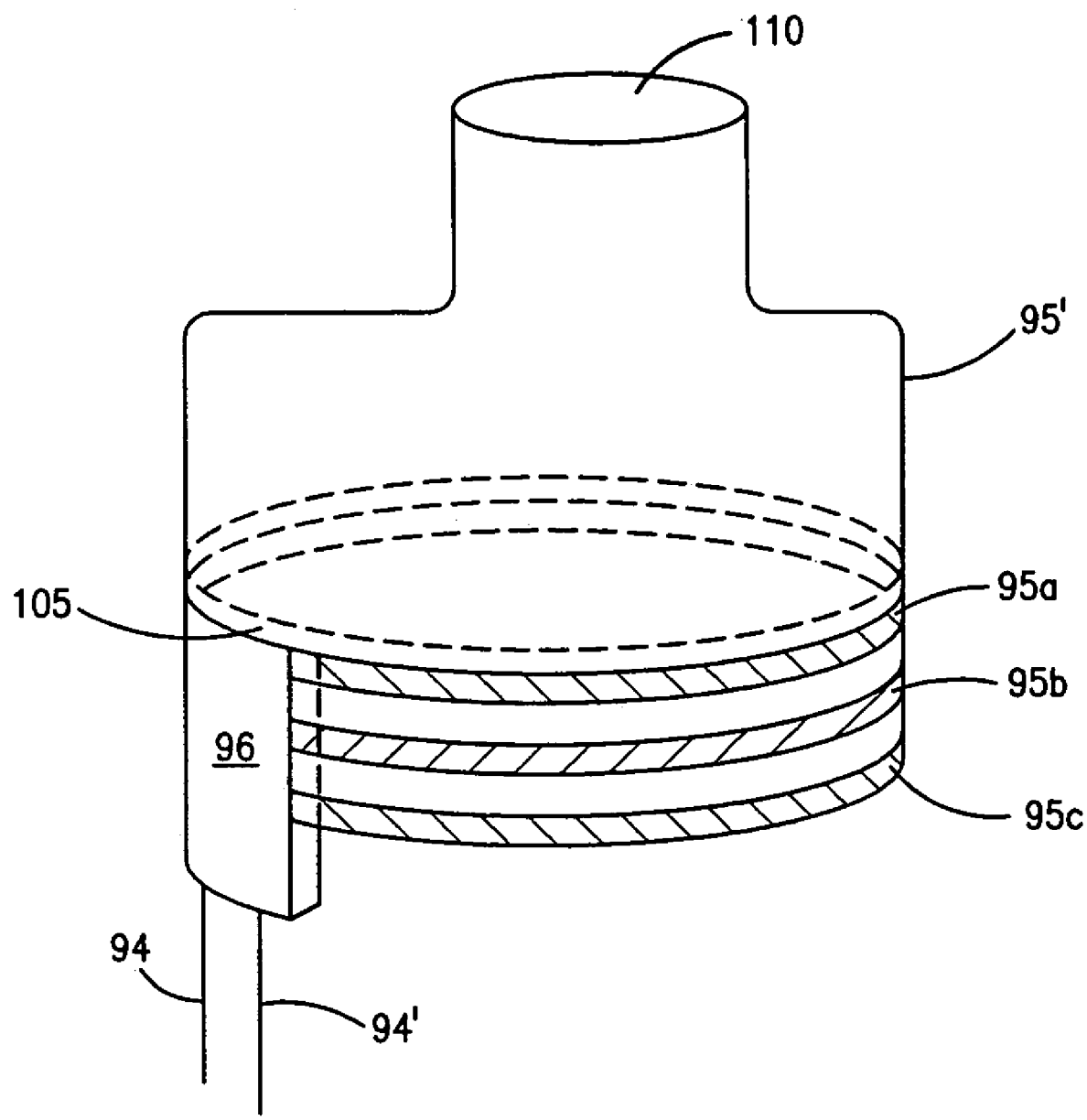
FIG. 3 illustrates one shield/cryo-pumping arrangement.

A wide variety of RF shields appear in an NMR probe: to shield the sample from RF coil leads; to shield the RF coil from agradient coil; to shield the cold currents from warm structures, etc. One example is the use of a floating RF shield in an RF probe to reduce irradiation of a sample from the leads to the RF coil 71, as taught in the U.S. Pat. No. 5,192,911, commonly assigned. One variant of the present work, as shown in FIG. 3, provides an electrically isolated RF shield 95' in thermal communication with heat exchanger 96 through a standoff annular member 105 and supported therefrom. The standoff is preferably formed of an electrically insulative, thermally conducting material such as sapphire. Annular space 110 accommodates the cold head 70. Multiple surfaces 95a, 95b, 95c are exemplary of the greater surface area desired for cryo-pumping purposes.

A second variant allows electrical connection of the RF shield 95 to probe and preamplifier 102 to provide for a shield at RF ground. Standoff 105 is therefore not required. Here, undesired thermal transport over the ground connection (from temperature $T_o$ to a circuit board 102 (housing signal conditioning circuits) at $T_1$ is minimal or insignificant through appropriate thermal design.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. An NMR cryogenic probe comprising:
   a) a cryostatic enclosure, said enclosure comprising a bore for accommodating a sample under study;
   b) an RF coil for coupling to said sample, c) a cold head disposed within said enclosure for thermally supporting an RF coil said cold head comprising a first heat exchanger for establishing a desired temperature $T_1-\Delta T$ for said RF coil;

d) a heater for supplying heat sufficient to adjust the temperature of said RF coil to $T_1$, and e) a cryo-pumping surface within said enclosure, said surface at least partially disposed proximate said cold head for stabilizing residual gas on said surface and comprising a second heat exchanger for maintaining said surfaces at selected temperatures $T_o < T_1$, said second heat exchanger being thermally independent of said first heat exchanger.

2. The NMR cryogenic probe of claim 1, wherein said second heat exchanger further comprises second coolant inflow means at temperature $T_o$ and second coolant outflow at temperature Ta such that $T_1 < T_a > T_o$, said first heat exchanger further comprises coolant inflow at temperature substantially $T_a > T_1$ and coolant outflow means at a temperature $\leq T_1$.

3. The NMR cryogenic probe of claim 2, wherein said second inflow and second outflow means forms a parallel coolant circuit in respect to first inflow and first outflow means.

4. The NMR cryogenic probe of claim 2, wherein said first coolant inflow means communicates with said second coolant outflow means to comprise a serial coolant circuit.

5. The NMR cryogenic probe of claim 1, wherein said cryo-pumping surface comprises an RF shield.

6. The NMR cryogenic probe of claim 5, wherein said cryo-pumping surface comprises an RF shield disposed around a portion of said RF coil.

7. The NMR cryogenic probe of claim 5, further comprising support means interposed between said second heat exchanger and said RF shield, said support means being electrically insulative and thermally conducting to isolate said shield.

8. The NMR cryogenic probe of claim 5, further comprising a preamplifier disposed within said cryostatic enclosure wherein said preamplifier comprises a signal ground conductor and the signal ground conductor communicates thermally with said second heat exchanger.

* * * * *